United States Patent
Zeng et al.

(10) Patent No.: US 9,952,736 B2
(45) Date of Patent: Apr. 24, 2018

(54) OLED ARRAY SUBSTRATE, DISPLAY PANEL AND DISPLAY DEVICE

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Yang Zeng, Shanghai (CN); Xingyao Zhou, Shanghai (CN); Lihua Wang, Shanghai (CN); Liang Liu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 0 days.

(21) Appl. No.: 15/398,717

(22) Filed: Jan. 5, 2017

(65) Prior Publication Data
US 2017/0115781 A1   Apr. 27, 2017

(30) Foreign Application Priority Data
Sep. 23, 2016   (CN) .......................... 2016 1 0846783

(51) Int. Cl.
*G06F 3/045*   (2006.01)
*H01L 27/32*   (2006.01)
*G06F 3/041*   (2006.01)

(52) U.S. Cl.
CPC ............ *G06F 3/045* (2013.01); *G06F 3/0412* (2013.01); *G06F 3/0414* (2013.01); *G06F 3/0416* (2013.01); *H01L 27/323* (2013.01); *H01L 27/3213* (2013.01); *H01L 27/3276* (2013.01); *G06F 2203/04105* (2013.01); *G06F 2203/04111* (2013.01)

(58) Field of Classification Search
None
See application file for complete search history.

(56) References Cited

U.S. PATENT DOCUMENTS

| | | | | |
|---|---|---|---|---|
| 2015/0015466 A1* | 1/2015 | Feng | .................... | G09G 3/2003 345/77 |
| 2016/0103545 A1* | 4/2016 | Filiz | ......................... | G01L 1/18 345/174 |

* cited by examiner

*Primary Examiner* — Christopher Kohlman
(74) *Attorney, Agent, or Firm* — Kilpatrick Townsend & Stockton LLP

(57) ABSTRACT

An OLED array substrate is provided. The OLED array includes multiple sub-pixels defined by multiple data lines and multiple scan lines, and a resistance-type pressure sensing element located in non-opening regions of the sub-pixels. The pressure sensing element includes multiple resistors. Each resistor has a serpentine wire structure. The serpentine wire structure includes a first sub-wire and a second sub-wire connected to two adjacent first sub-wires. Both the first sub-wire and the second sub-wire are located in non-opening regions of the sub-pixels on the OLED array substrate. The resistance-type pressure sensing element is arranged in a display region of the OLED array substrate without influencing the display effect of a display panel or a display device. An extension direction of a projection of the first sub-wire on an array substrate intersects with extension directions of projections of the data lines and the scan lines on the array substrate.

19 Claims, 11 Drawing Sheets

OLED ARRAY SUBSTRATE, DISPLAY PANEL AND DISPLAY DEVICE

CROSS REFERENCE TO RELATED APPLICATION

The present application claims the priority to Chinese Patent Application No. 201610846783.4, entitled "OLED ARRAY SUBSTRATE, DISPLAY PANEL AND DISPLAY DEVICE", filed on Sep. 23, 2016 with the State Intellectual Property Office of the People's Republic of China, which is incorporated herein by reference in its entirety.

TECHNICAL FIELD

The present disclosure relates to the field of display technology, and in particular to an Organic Light Emitting Diode (OLED) array substrate, a display panel and a display device.

BACKGROUND

A pressure sensing technology is applying a pressure sensing device on a screen of a mobile phone, and a light touch and a heavy touch on a screen by a finger may bring different interaction effects. That is, a screen may sense different pressure, such as, a light touch, a normal touch and a heavy touch, and may sense operations of a finger vividly, thus, diversified operating modes may be achieved.

A resistance-type pressure sensing element is used in a conventional OLED display panel to achieve pressure sensing. As shown in FIG. 1 and FIG. 2, FIG. 1 is a schematic structural diagram of a resistance-type pressure sensing element, and FIG. 2 is an equivalent circuit diagram of a resistance-type pressure sensing element. The resistance-type pressure sensing element includes a first resistor R1, a second resistor R2, a third resistor R3 and a fourth resistor R4, and the four resistors form a Wheatstone bridge. A common terminal of the first resistor R1 and the fourth resistor R4 is connected to a direct current voltage source $V_{DC}$, and a common terminal of the second resistor R2 and the third resistor R3 is grounded. The common terminal of the first resistor R1 and the fourth resistor R4, and the common terminal of the second resistor R2 and the third resistor R3 are configured to detect a voltage signal.

However, as a frame region is becoming narrower, a resistance-type pressure sensing element cannot be arranged in the frame region, and arranging it in a display region will influence the display effect of an OLED display panel.

SUMMARY

In view of the above, an OLED array substrate, a display panel and a display device are provided according to the present disclosure, to solve a problem in the conventional technology that the display effect is influenced in a case that a resistance-type pressure sensing element is arranged in a display region of an OLED panel.

In order to achieve the above object, the following technical solutions are provided according to the present disclosure.

An OLED array substrate is provided according to present disclosure. The OLED array substrate includes multiple insulated data lines and multiple insulated scan lines, multiple sub-pixels defined by the multiple data lines and the multiple scan lines, and a resistance-type pressure sensing element. The data line extends in a first direction, and the scan line extends in a second direction.

The multiple sub-pixels include a first sub-pixel row, a second sub-pixel row and a third sub-pixel row, all of which are arranged in the first direction in a certain sequence repeatedly. The first sub-pixel row includes first sub-pixels and second sub-pixels arranged alternately in the second direction, the second sub-pixel row includes third sub-pixels arranged in the second direction, and the third sub-pixel row includes fourth sub-pixels and fifth sub-pixels arranged alternately in the second direction. In the first direction, the third sub-pixel is located between the first sub-pixel and the fourth sub-pixel, and in the second direction, the third sub-pixel is located between the first sub-pixel and the second sub-pixel.

The resistance-type pressure sensing element includes multiple resistors, and each of the multiple resistors includes a serpentine wire. The serpentine wire includes a first sub-wire, and a second sub-wire which is located at one end of the first sub-wire and connected to two adjacent first sub-wires.

Both the first sub-wire and the second sub-wire are located non-opening regions of the multiple sub-pixels, and an extension direction of a projection of the first sub-wire on the array substrate intersects with extension directions of projections of the multiple data lines and the multiple scan lines on the array substrate.

It can be seen from the above technical solutions, the OLED array substrate according to present disclosure includes multiple sub-pixels defined by multiple data lines and multiple scan lines, and a resistance-type pressure sensing element located in non-opening regions of the multiple sub-pixels. The resistance-type pressure sensing element includes multiple resistors, and each of the multiple resistors has a serpentine wire structure. The serpentine wire structure includes a first sub-wire and a second sub-wire which is located at one end of the first sub-wire and connected to two adjacent first sub-wires. Both the first sub-wire and the second sub-wire are located in non-opening regions of the multiple sub-pixels, and the resistance-type pressure sensing element is arranged in a display region of the OLED array substrate without influencing the display effect of a display panel or a display device.

Further, an extension direction of a projection of the first sub-wire on an array substrate intersects with extension directions of projections of the multiple data lines and the multiple scan lines on the array substrate. The resistance-type pressure sensing element according to the present disclosure obtains a variation in a voltage signal by detecting a stress difference in a direction of the first sub-wire, and the variation is greater than a variation in a voltage signal corresponding to a stress difference in the X direction and the Y direction in the conventional technology. Therefore, a good pressure sensing signal can be obtained, and pressure sensing detecting performance is improved.

An OLED display panel and an OLED display device are further provided according to the present disclosure. The OLED display panel includes the above OLED array substrate, and the OLED display device includes the OLED display panel. A resistance-type pressure sensing element is arranged in a display region of the OLED display panel and the OLED display device without influencing the display effect.

BRIEF DESCRIPTION OF THE DRAWINGS

To illustrate technical solutions according to embodiments of the present disclosure or in the conventional technologies more clearly, drawings to be used in the descriptions of the conventional technologies or the embodiments are described briefly hereinafter. Apparently, the drawings described hereinafter are only for some embodiments of the present disclosure, and other drawings may be obtained by those skilled in the art based on those drawings without creative efforts.

DETAILED DESCRIPTION OF THE EMBODIMENTS

Technical solutions of the embodiments of the present disclosure are illustrated clearly and completely in conjunction with the following drawings of the embodiments of the disclosure. Apparently, the described embodiments are merely a few rather than all of the embodiments of the present disclosure. All other embodiments obtained by persons of ordinary skill in the art based on the embodiments of the present disclosure without creative efforts shall fall within the protection scope of the present disclosure.

Figure 1:
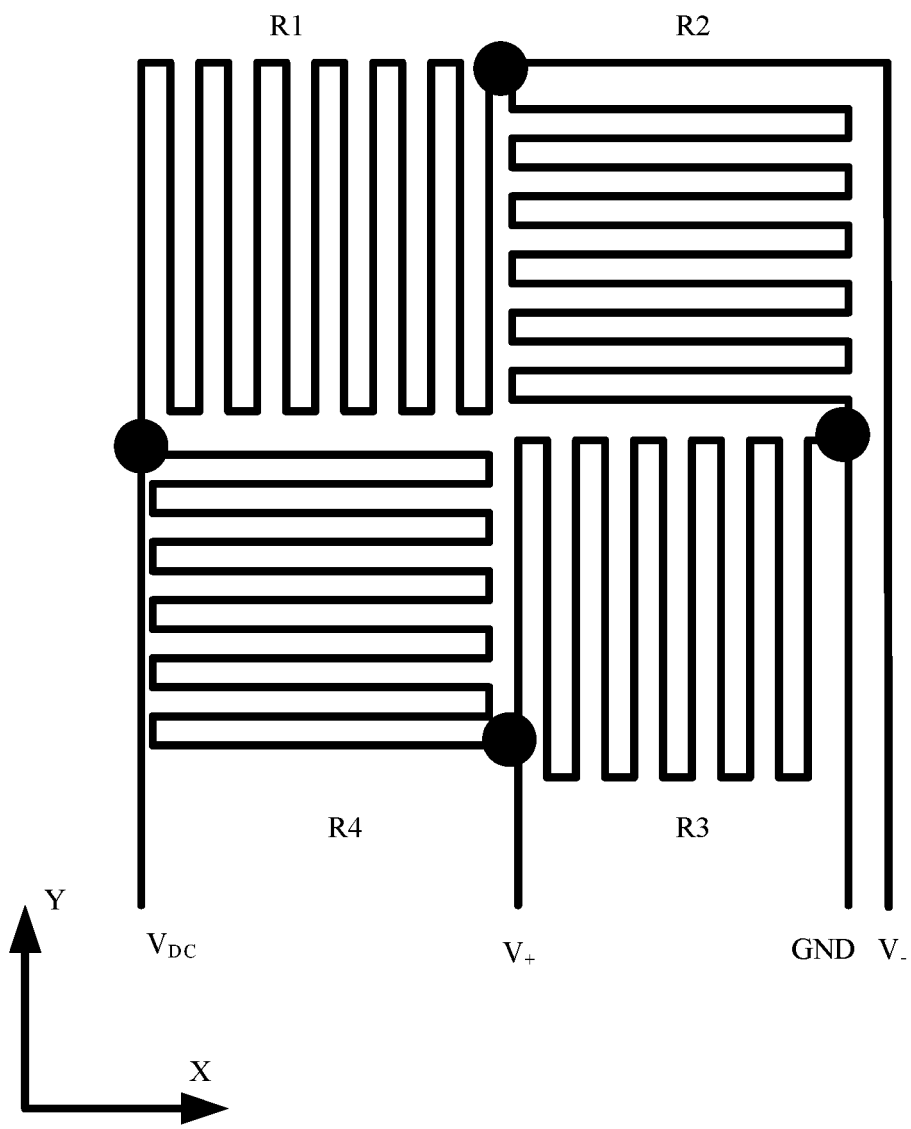
FIG. 1 is an arrangement schematic diagram of a resistance-type pressure sensing element in a frame region in the conventional technology.
Figure 2:
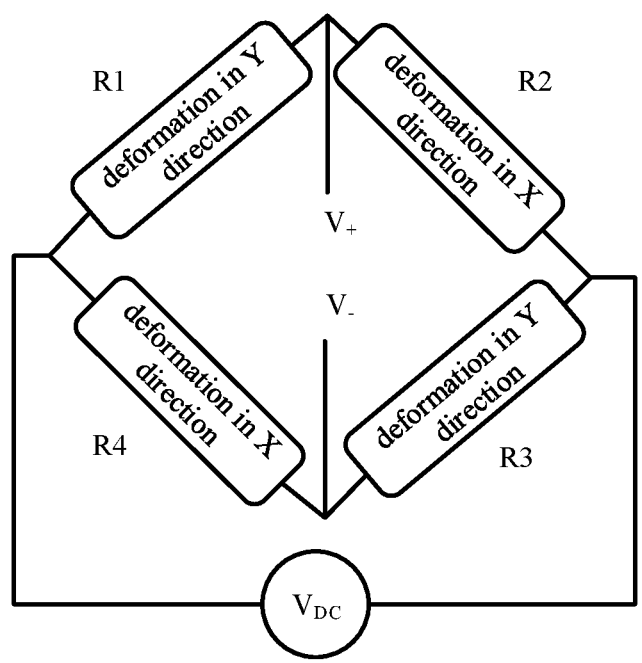
FIG. 2 is a schematic structural diagram of a conventional resistance-type pressure sensing element.

A conventional touch display panel is generally rectangle, and includes a display region and a black frame region encircling the display region. In the conventional technology, a resistance-type pressure sensing element shown in FIG. 1 is arranged in the frame region. A variation in a voltage signal is read based on a strain difference in two orthogonal directions, i.e., the X direction and the Y direction, when a display panel is deformed caused by pressing, thereby achieving pressure sensing.

Figure 3:
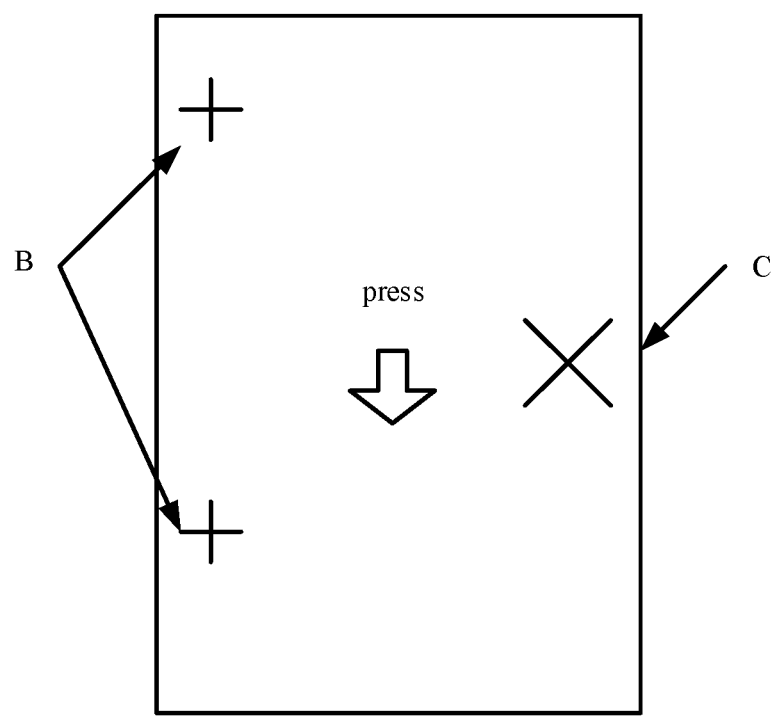
FIG. 3 is a comparison diagram of variations in voltage signals when a touch display panel is pressed.

For a touch display panel with the fixed periphery, directions of wires of the resistance-type pressure sensing element are shown in FIG. 1, and the directions of wires are parallel or perpendicular to that of a fixed frame around the touch display panel. The read voltage signal based on the deformation caused by pressing is shown in simplified formed in FIG. 3. FIG. 3 is a comparison diagram of variations in voltage signals generated on a frame region in different directions when a touch display panel is pressed. The variations in voltage signals in the X direction and Y direction (it is B shown in FIG. 3) based on deformation caused by pressing are small, and the variation in a voltage signal in a direction at an angle of 45° with respect to the fixed frame enclosing the touch display panel (it is C shown in FIG. 3) based on deformation caused by pressing is large.

Since long wires in a serpentine wire of a conventional electrical bridge structure extend in the X direction or in the Y direction, but not in directions where the variations in voltage signals are large, the bad pressure detection performance in the conventional technology results. In addition, a conventional resistance-type pressure sensing element is arranged in the frame region. With the development trend of a narrow frame, the frame region is becoming smaller, and the resistance-type pressure sensing element cannot be arranged in the frame region. Particularly, if a display panel without a frame is developed in the future, the resistance-type pressure sensing element cannot be used to achieve pressure detection.

For these reasons, an OLED array substrate, a display panel and a display device are provided according to the present disclosure. The OLED array substrate includes multiple insulated data lines and multiple insulated scan lines, multiple sub-pixels and a resistance-type pressure sensing element.

The data line extends in a first direction, the scan line extends in a second direction, and the multiple data lines and the multiple scan lines define the multiple sub-pixels. The sub-pixels include a first sub-pixel row, a second sub-pixel row and a third sub-pixel row, all of which are arranged in the first direction in a certain sequence repeatedly. The first sub-pixel row includes first sub-pixels and second sub-pixels arranged alternately in the second direction, the second sub-pixel row includes third sub-pixels arranged in the second direction, and the third sub-pixel row includes fourth sub-pixels and fifth sub-pixels arranged alternately in the second direction. In the first direction, the third sub-pixel is located between the first sub-pixel and the fourth sub-pixel, and in the second direction, the third sub-pixel is located between the first sub-pixel and the second sub-pixel.

The resistance-type pressure sensing element includes multiple resistors, and each of the multiple resistors includes a serpentine wire. The serpentine wire includes a first sub-wire and a second sub-wire which is located at one end of the first sub-wire and connected to two adjacent first sub-wires. Both the first sub-wire and the second sub-wire are located in non-opening regions of the multiple sub-pixels, and an extension direction of a projection of the first sub-wire on an array substrate intersects with extension directions of projections of the multiple data lines and the multiple scan lines on the array substrate.

In the present disclosure, the resistance-type pressure sensing element is arranged in the non-opening region of the pixel, in a display region without influencing the display effect. The serpentine wire of the resistance-type pressure sensing element extends in a third direction where the serpentine wire intersects with both the data line and the scan line, thereby improving detection performance of the resistance-type pressure sensing element.

In order to make the above technical solutions, features and advantages of the present disclosure clearer and more straightforward, hereinafter embodiments of the present disclosure are described in detail in conjunction with drawings.

Figure 4:
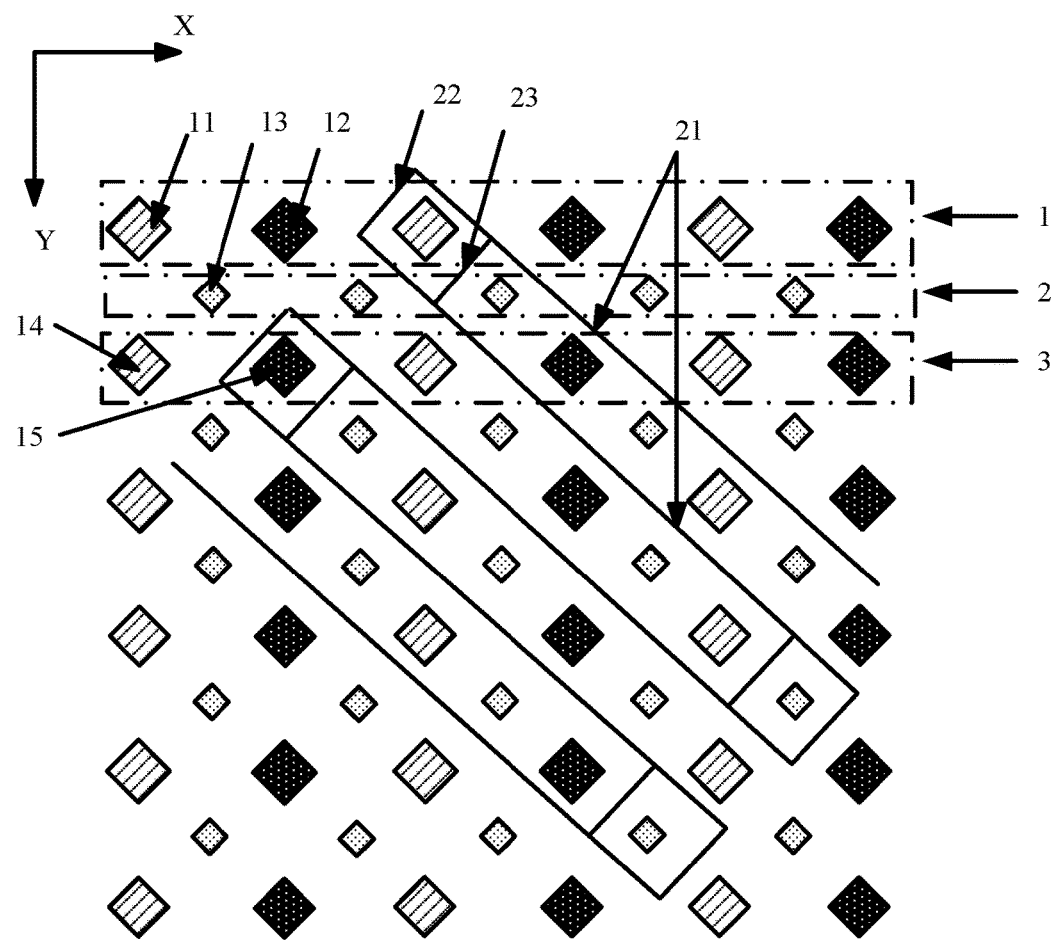
FIG. 4 is a schematic diagram of sub-pixels and pressure sensing wires on an OLED array substrate according to an embodiment of the present disclosure.

FIG. 4 is a schematic diagram illustrating an arrangement of multiple sub-pixels and a serpentine wire of a resistor on an OLED array substrate. Reference is made to FIG. 4. An OLED array substrate according to an embodiment of the present disclosure includes multiple insulated data lines (not shown in the figure) and multiple insulated scan lines (not shown in the figure). The data line extends in a first direction, the scan line extends in a second direction, and the multiple data lines and the multiple scan lines define multiple sub-pixels. It should be noted that, in the embodiment, the first direction is the Y direction in FIG. 4, and the second direction is the X direction in FIG. 4.

The multiple sub-pixels include a first sub-pixel row 1, a second sub-pixel row 2 and a third sub-pixel row 3, all of which are arranged in the first direction Y in a certain sequence repeatedly. The first sub-pixel row 1 includes first sub-pixels 11 and second sub-pixels 12 arranged alternately in the second direction X, the second sub-pixel row 2 includes third sub-pixels 13 arranged in the second direction X, the third sub-pixel row 3 includes fourth sub-pixels 14 and fifth sub-pixels 15 arranged alternately in the second direction X.

In the first direction Y, the third sub-pixel 13 is located between the first sub-pixel 11 and the fourth sub-pixel 14, and in the second direction X, the third sub-pixel 13 is located between the first sub-pixel 11 and the second sub-pixel 12. That is, the multiple sub-pixels in the embodiment are arranged in the pentile pixel arrangement mode. In the first direction Y, the third sub-pixel 13 is located between the first sub-pixel 11 and the fourth sub-pixel 14, and in the second direction X, the third sub-pixel 13 is located between the first sub-pixel 11 and the second sub-pixel 12. In the third sub-pixel row 3, the fourth sub-pixel 14 and the fifth sub-pixel 15 are alternately arranged in the sequence listed. Therefore, the third sub-pixel 13 is also located between the fourth sub-pixel 14 and the fifth sub-pixel 15, that is, the third sub-pixel 13 is located in a region enclosed by the first sub-pixel 11, the second sub-pixel 12, the fourth sub-pixel 14 and the fifth sub-pixel 15.

It should be noted that, in the embodiment, in the first direction Y, the third sub-pixel 13 is located between the first sub-pixel 11 and the fourth sub-pixel 14, and in the second direction X, the third sub-pixel 13 is located between the first sub-pixel 11 and the second sub-pixel 12. However, the third sub-pixel 13 is neither limited to be located in the very middle between the first sub-pixel 11 and the fourth sub-pixel 14, nor limited to be located in the very middle between the first sub-pixel 11 and the second sub-pixel 12. Based on the practical pixel situation, the position of the third sub-pixel 13 may be offset with respect to the very middle.

Reference is made to FIG. 4. The first sub-pixel row 1, the second sub-pixel row 2 and the third sub-pixel row 3 are arranged in the first direction Y in a certain sequence repeatedly. That is, the first sub-pixel row 1 is located between two second sub-pixel rows 2, the second sub-pixel row 2 is located between the first sub-pixel row 1 and the third sub-pixel row 3, and the third sub-pixel row 3 is located between two second sub-pixel rows 2. The multiple sub-pixels include multiple first sub-pixel rows, multiple second sub-pixel rows and multiple third sub-pixel rows.

Reference is made to FIG. 4 again. The first sub-pixel row 1 includes the first sub-pixels 11 and the second sub-pixels 12 alternately arranged in the second direction X. The second sub-pixel row 2 includes the third sub-pixels 13 arranged in the second direction X. The third sub-pixel row 3 includes the fourth sub-pixels 14 and the fifth sub-pixels 15 alternately arranged in the second direction X. Specific colors of the first sub-pixel 11, the second sub-pixel 12, the third sub-pixel 13, the fourth sub-pixel 14 and the fifth sub-pixel 15 are not limited in the embodiment, but it should be noted that, the first sub-pixel to the fifth sub-pixel include at least a red pixel, a green pixel and a blue pixel.

Since luminous efficiency of the green pixel in OLED is high, and luminous efficiency of the red pixel and the blue pixel in OLED is low, the area of the green pixel may be smaller than that of the red pixel and blue pixel in fabrication. Optionally, in the embodiment, as shown in FIG. 4, both the first sub-pixel 11 and the fourth sub-pixel 14 are the red pixels, both the second sub-pixel 12 and the fifth sub-pixel 15 are the blue pixels, and the third sub-pixel 13 is the green pixel. Alternatively, both the first sub-pixel 11 and the fourth sub-pixel 14 are the blue pixels, both the second sub-pixel 12 and the fifth sub-pixel 15 are the red pixels, and the third sub-pixel 13 is the green pixel.

Figure 5:
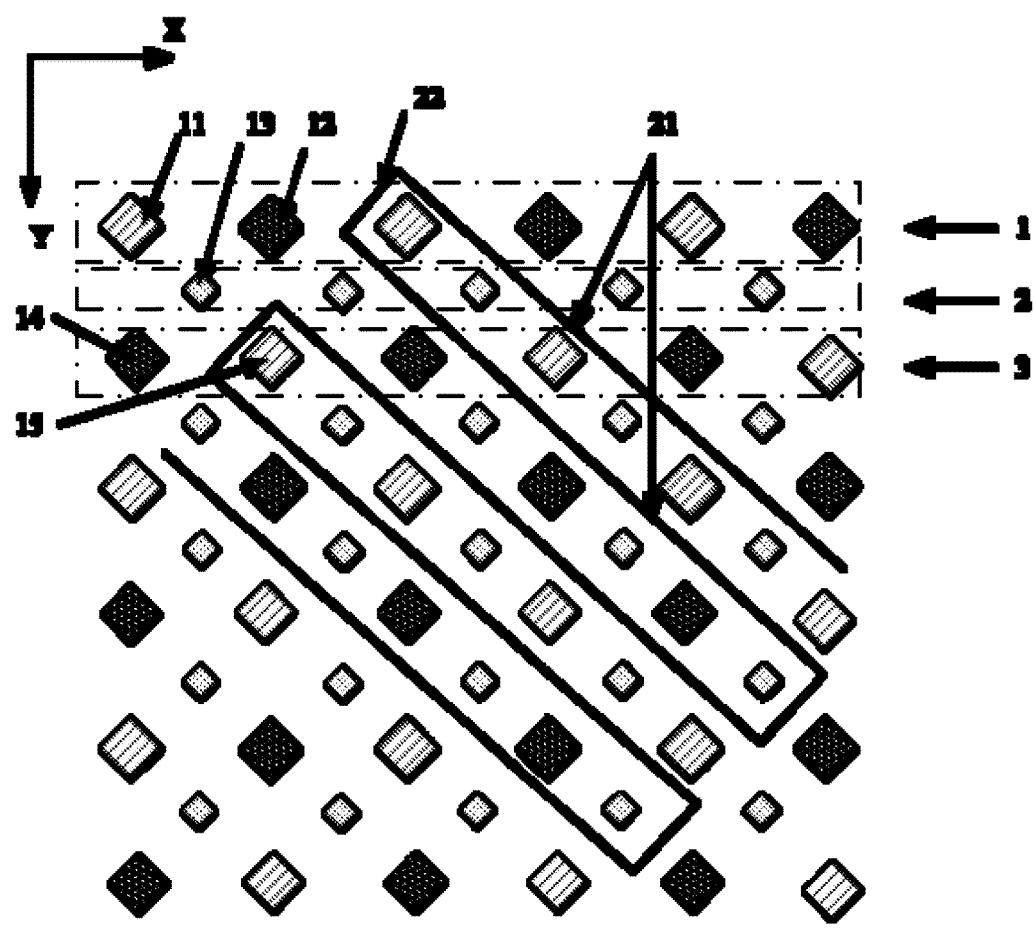
FIG. 5 is a schematic diagram of sub-pixels and pressure sensing wires on an OLED array substrate according to another embodiment of the present disclosure.

In the embodiment, the colors of the multiple sub-pixels may also be as shown in FIG. 5. Both the first sub-pixel 11 and the fifth sub-pixel 15 are the blue pixels, both the second sub-pixel 12 and the fourth sub-pixel 14 are the red pixels, and the third sub-pixel 13 is the green pixel. Alternatively, both first sub-pixel 11 and the fifth sub-pixel 15 are the red pixels, both the second sub-pixel 12 and the fourth sub-pixel 14 are the blue pixels, and the third sub-pixel 13 is the green pixel.

If the third sub-pixel 13 is not the green pixel, in a direction at an angle of 45° with the X direction, two sub-pixels with a large area may be adjacent to each other. Requirements on evaporation of sub-pixels are high, if edges of the adjacent sub-pixels are close. In FIG. 4 and FIG. 5, a sub-pixel with a large area and a sub-pixel with a small area are alternately arranged in a direction at an angle of 45° with the X direction. Therefore, even if edges of adjacent sub-pixels are close, the two adjacent sub-pixels can be distinguished and well evaporated, thereby reducing the requirements on evaporation technology.

The resistance-type pressure sensing element in the embodiment includes multiple resistors. When an OLED array substrate is pressed or touched, the resistance of the resistor varies, and thus a voltage across the resistor varies. By detecting the variation in the voltage, the pressure detection is achieved. As shown in FIG. 4 and FIG. 5, in the embodiment, each of the multiple resistors includes a serpentine wire, and the serpentine wire includes a first sub-wire 21 and a second sub-wire 22 which is located at one end of the first sub-wire 21 and connected to two adjacent first sub-wires 21.

Both the first sub-wire 21 and the second sub-wire 22 are located non-opening regions of multiple sub-pixels, and an extension direction of a projection of the first sub-wire 21 on an array substrate intersects with extension directions of projections of the multiple data lines and the multiple scan lines on the array substrate.

Figure 6:
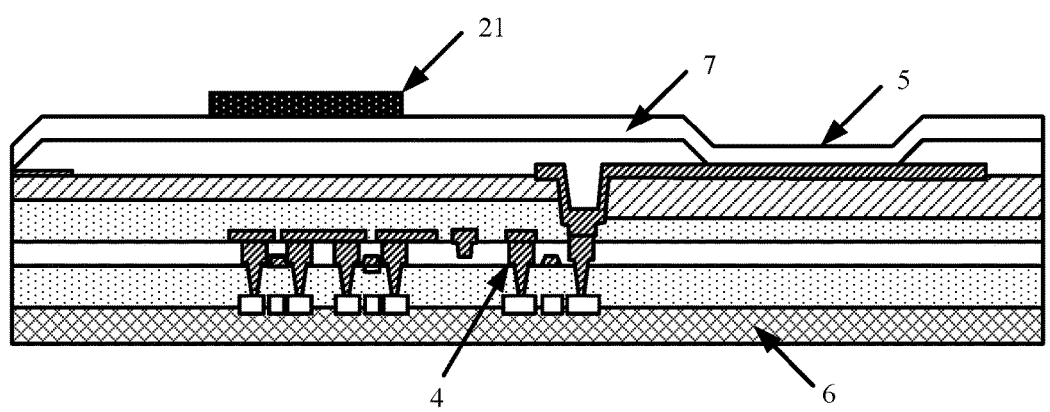
FIG. 6 is a schematic cross-sectional diagram of an OLED array substrate according to an embodiment of the present disclosure.

The non-opening region is a non-light emitting portion of OLED. Reference is made to FIG. 6, which is a schematic cross-sectional diagram of an OLED array substrate. Each sub-pixel further includes Thin Film Transistor (TFT) structure 4 and an OLED light emitting region 5. The OLED light emitting region 5 is the opening region in the embodiment, which is configured to emit light, and the non-opening region is a region of each sub-pixel except the opening region. Pressure sensing wires of the resistance-type pressure sensing element in the embodiment (including a first sub-wire 21 in FIG. 6) are located in the non-opening region of the sub-pixel. The OLED array substrate further includes a substrate 6. The resistance-type pressure sensing element and the multiple sub-pixels are located on the same side of the substrate 6. The resistance-type pressure sensing element is arranged on the surface of a thin film encapsulation layer 7 of the OLED array substrate which is away from the substrate 6. That is, the pressure sensing wires are arranged in the non-opening region on the surface of the thin film encapsulation layer 7 which is away from the substrate 6.

An extension direction of a projection of the first sub-wire 21 on the array substrate intersects with extension directions of projections of all the multiple data lines and the multiple scan lines on the array substrate. That is, the extension direction of the projection of the first sub-wire 21 is neither parallel to that of the data line nor parallel to that of the scan line.

Figure 7:
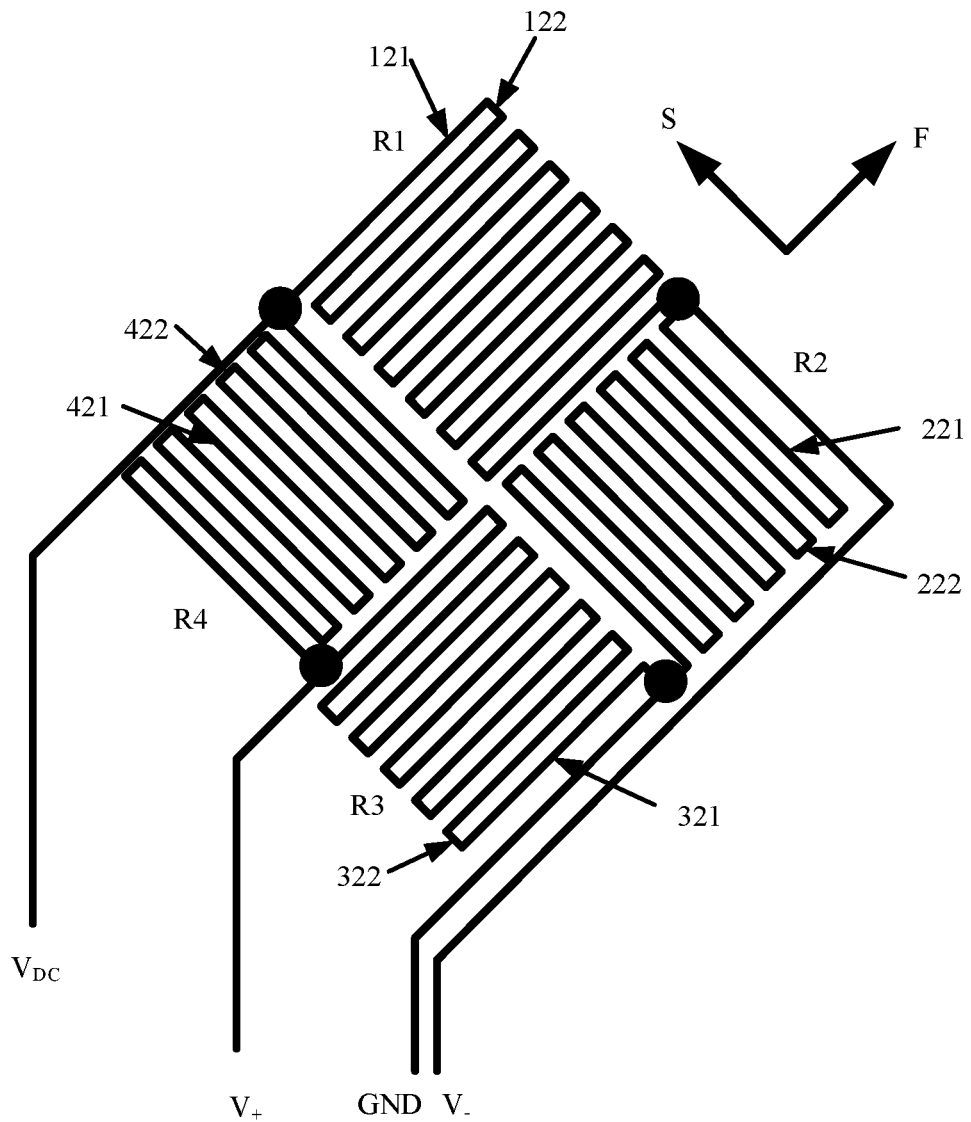
FIG. 7 is an arrangement schematic diagram of a resistance-type pressure sensing element in a frame region according to an embodiment of the present disclosure.

The resistance-type pressure sensing element includes multiple resistors, and the number of the resistors is not limited in the embodiment. Optionally, the resistance-type pressure sensing element has an electrical bridge structure formed by a first resistor, a second resistor, a third resistor and a fourth resistor. As shown in FIG. 7, one end of the first resistor R1 is connected to one end of the second resistor R2, the other end of the first resistor R1 is connected to one end of the fourth resistor R4, the other end of the fourth resistor R4 is connected to one end of the third resistor R3, and the other end of the third resistor R3 is connected to the other end of the second resistor R2. A common terminal of the first resistor R1 and the fourth resistor R4 is connected to a direct current voltage source $V_{DC}$, and a common terminal of the second resistor R2 and the third resistor R3 is connected to the ground GND. A common terminal of the first resistor R1 and the second resistor R2, and a common terminal of the third resistor R3 and the fourth resistor R4 are configured to detect a variation in a voltage signal, and are connected to a detection terminal V+ and a detection terminal V−, respectively.

A first sub-wire 121 of the first resistor R1 and a first sub-wire 321 of the third resistor R3 both extend in a third direction (the F direction in FIG. 7), and a first sub-wire 221 of the second resistor R2 and a first sub-wire 421 of the fourth resistor R4 both extend in a fourth direction (the S direction in FIG. 7).

The relationship between the fourth direction and the third direction is not limited to this embodiment. Optionally, the fourth direction S is perpendicular to the third direction F. As shown in FIG. 7, when being pressed, the resistance-type pressure sensing element is deformed, and thus a voltage variation signal is read based on a strain difference in the two orthogonal directions caused by the deformation.

Similarly, directions of the second sub-wire 122 of the first resistor R1, the second sub-wire 322 of the third resistor R3, the second sub-wire 222 of the second resistor R2 and the second sub-wire 422 of the fourth resistor R4 are not limited to this embodiment. Optionally, both the direction of the second sub-wire 122 of the first resistor R1 and the direction of the second sub-wire 322 of the third resistor R3 extend in the fourth direction S, and both the direction of the second sub-wire 222 of the second resistor R2 and the direction of the second sub-wire 422 of the fourth resistor R4 extend in the third direction F, so that a resistance variation of the second sub-wire of the resistor in pressing and deforming is added onto that of the first sub-wire in a corresponding direction.

The four resistors of the resistance-type pressure sensing element in the embodiment form a Wheatstone bridge structure. The first resistor R1 and the third resistor R3 form one bridge arm, and the second resistor R2 and the fourth resistor R4 form the other bridge arm. In a case that there is no touch and press from the outside, the Wheatstone bridge is in a balanced state, a relation R1\*R3=R2\*R4 is satisfied, and voltages at two detection terminals shown in FIG. 7 are the same, namely, V+=V−. In a case that there is touch and press, the resistance varies, the Wheatstone bridge is no longer balanced, a voltage is varies, and thus voltages at both the detection terminal V+ and the detection terminal V− varies.

In order to compute a voltage variation caused by a resistance variation of the Wheatstone bridge, optionally in the embodiment, the first resistor R1, the second resistor R2, the third resistor R3 and the fourth resistor R4 have same structures. Lengths and widths of first sub-wires, lengths and widths of second sub-wires, and angles between the first sub-wire and second sub-wire of the first resistor R1, the second resistor R2, the third resistor R3 and the fourth resistor R4 are the same, respectively. The difference is that, an extension direction of the first sub-wire of the first resistor R1 is the same as that of the first sub-wire of the third resistor R3, and an extension direction of the first sub-wire of the second resistor R2 is the same as that of the first sub-wire of the fourth resistor R4.

Figure 8:
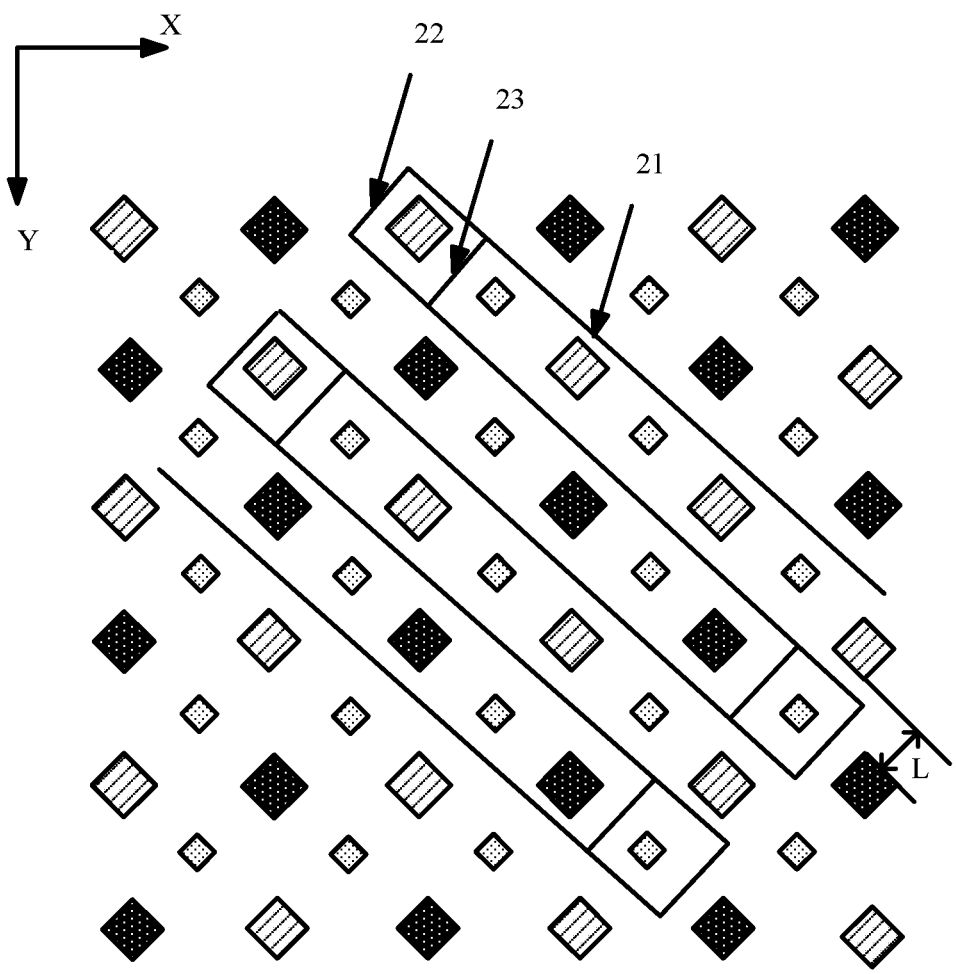
FIG. 8 is a schematic diagram of sub-pixels and pressure sensing wires on an OLED array substrate according to another embodiment of the present disclosure.

It should be noted that, the existence of the second sub-wire increases a resistance variation in the extension direction of the second sub-wire. To reduce a resistance variation of the first sub-wire caused by the resistance variation of the second sub-wire, in the embodiment, as shown in FIG. 8, the first resistor further includes a third sub-wire 23. The third sub-wire 23 is connected to adjacent first sub-wires 21, and at least one sub-pixel is arranged between the third sub-wire 23 and the second sub-wire 22.

Since the third sub-wire 23 is also connected to the first sub-wire 21, and the second sub-wire 22 and the third sub-wire 23 in the first resistor are connected in parallel. In this case, if a resistance in a direction of the second sub-wire 22 decreases, a resistance variation of the second sub-wire 22 decreases, and thus the effect of the resistance variation of the second sub-wire 22 on the resistance variation in a direction of the first sub-wire 21 is reduced. The resistances of the first resistor, the second resistor, the third resistor and the fourth resistor are mainly determined by the first sub-wire. Optionally, in the embodiment, the third sub-wire is arranged in parallel to the second sub-wire.

The number of sub-pixels between the third sub-wire and the second sub-wire is not limited to this embodiment. However, the more the number of sub-pixels between the third sub-wire 23 and the second sub-wire 22 is, the more the number of the first sub-wire 21 in parallel will be, and the smaller the resistance of the first sub-wire 21 will be. Therefore, in order not to decrease the resistance of the first sub-wire 21, optionally, only one sub-pixel is arranged between the second sub-wire 22 and the third sub-wire 23.

In addition, a distance between two adjacent first sub-wires in each resistor is not limited in the embodiment. However, the longer the distance between two adjacent first sub-wires in each resistor is, the longer a length of the second sub-wire will be. In order to decrease the length of the second sub-wire, and further decrease the resistance of the second sub-wire, optionally in the embodiment, one sub-pixel is arranged between two adjacent first sub-wires in each resistor.

It should be noted that, a distance between non-opening regions of sub-pixels, which is denoted as L in FIG. 8, is generally greater than ten microns and less than twenty microns. In the embodiment, an angle between an extension direction of the first sub-wire 21 of the first resistor and the X direction may depend on a direction of the first sub-wire 21 of the first resistor in the non-opening region, as long as the wires are arranged in the non-opening region of the sub-pixel. Therefore, as for a pixel arrangement mode shown in FIG. 8, an angle between the third direction and the first direction in the embodiment ranges from 40° to 50°, inclusively. That is, the angle between the extension direction of the first sub-wire and the X direction ranges from 40° to 50°, inclusively. Optionally, in the embodiment, the angle between the third direction, which is an extension direction of the first sub-wire of the first resistor, and the first direction X is 45°, so that the first sub-wire of the first resistor extends along an edge line of the sub-pixel, thereby avoiding the overlap between the first sub-wire of the first resistor and the opening region of the sub-pixel, and avoiding blocking emitting light.

In order to make fabrication of pressure sensing wires convenient, optionally in the embodiment, for each resistor, a width of the first sub-wire is the same as that of the second sub-wire. In addition, if the width of the first sub-wire is too small, a broken situation tends to occur, and the distance L between non-opening regions of sub-pixels is about tens of micrometer. Therefore, optionally in the embodiment, the distance between the first sub-wire and the second sub-wire ranges from 2 μm to 10 μm, inclusively.

Figure 9:
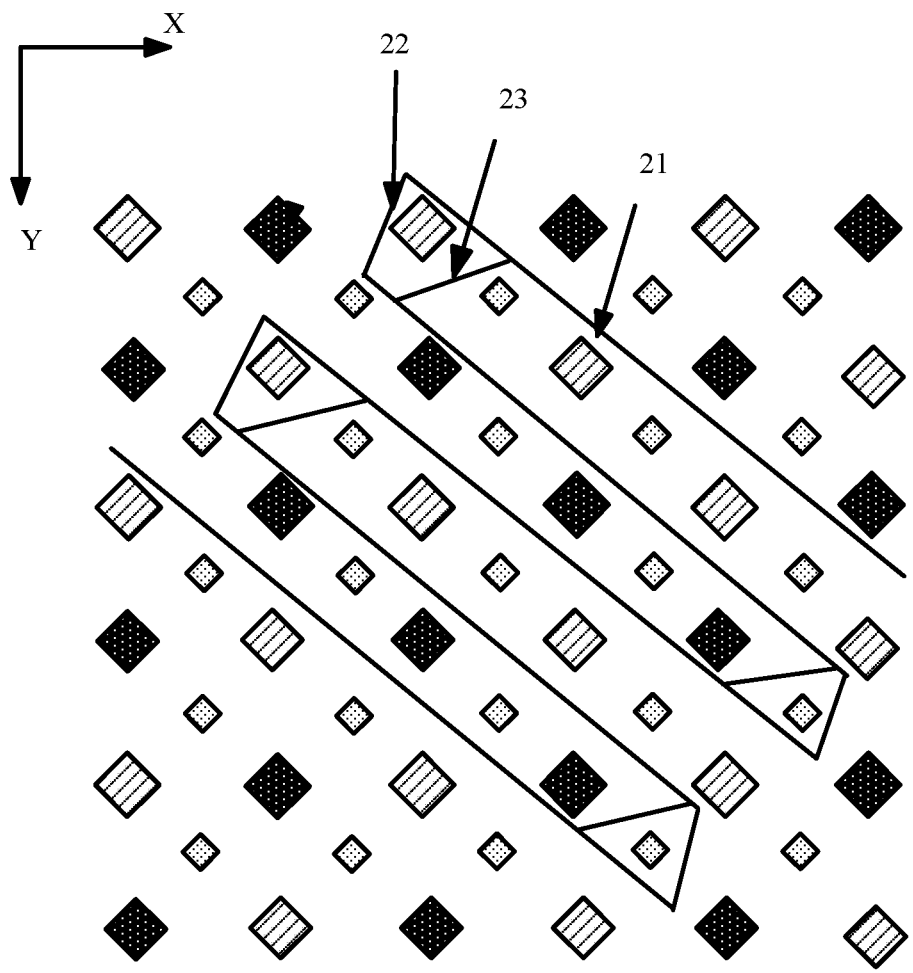
FIG. 9 is a schematic diagram of sub-pixels and pressure sensing wires on an OLED array substrate according to another embodiment of the present disclosure.

If the distance between the first sub-wire and the second sub-wire is narrow, the opening region of the sub-pixel may not be arranged in a direction at an angle of 45° with the X direction. As shown in FIG. 9, the first sub-wire 21 is not perpendicular to the second sub-wire 22, and the angle between the extension direction of the first sub-wire 21 and the first direction X is smaller than 45°. Similarly, the third sub-wire 23 may also not be arranged in parallel to the second sub-wire 22.

It should be noted that, the portion outside the pixel opening region is black, and the pressure sensing wires are arranged in the non-opening regions and basically have no effect on pixel display. Therefore, in the embodiment, the pressure sensing wires may be non-transparent metal wires.

The serpentine wire arranged on the OLED array substrate according to the embodiment includes a first sub-wire and a second sub-wire which is located at one end of the first sub-wire and connected to two adjacent first sub-wires. Both the first sub-wire and the second sub-wire are located in non-opening regions of multiple sub-pixels. Therefore, it is achieved that the resistance-type pressure sensing element is arranged in a display region without influencing the display effect of OLED.

Further, an extension direction of a projection of the first sub-wire on the array substrate intersects with extension directions of projections of the multiple data lines and the multiple scan lines on the array substrate. When there are touch and press on an OLED array substrate from the outside, a generated resistance variation in a direction of the frame is small, and a generated resistance variation in a direction at an angle of 45° with the frame is large, because periphery of the OLED array substrate is fixed. Therefore, the first sub-wires of the first resistor and the third resistor are arranged in an inclined manner and have a certain angle with the periphery of the OLED array substrate, and the angle may be selected as 45°, so that the resistance variation is increased and the variation in the voltage signal variation is large, thereby achieving a good pressure detection performance.

Figure 10:
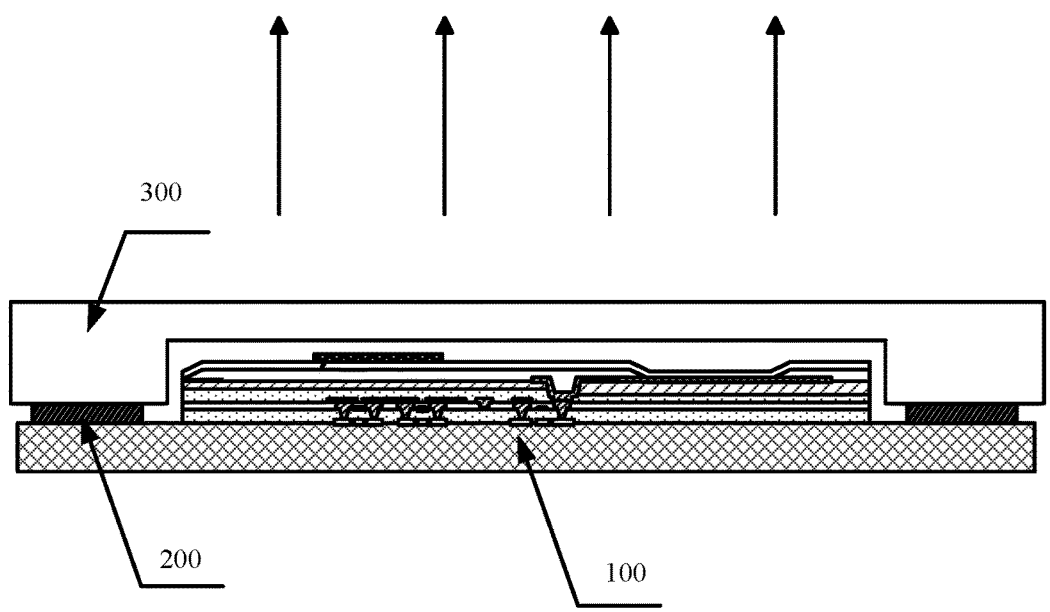
FIG. 10 is a schematic structural diagram of an OLED display panel according to an embodiment of the present disclosure.

An OLED display panel is further provided according to an embodiment of the present disclosure, as shown in FIG. 10, which includes the above OLED array substrate 100 and a package substrate 300. The package substrate 300 fits with the OLED array substrate 100 via a packaging adhesive 200. A light emitting direction of the OLED display panel is indicated by the arrow in the figure.

Figure 11:
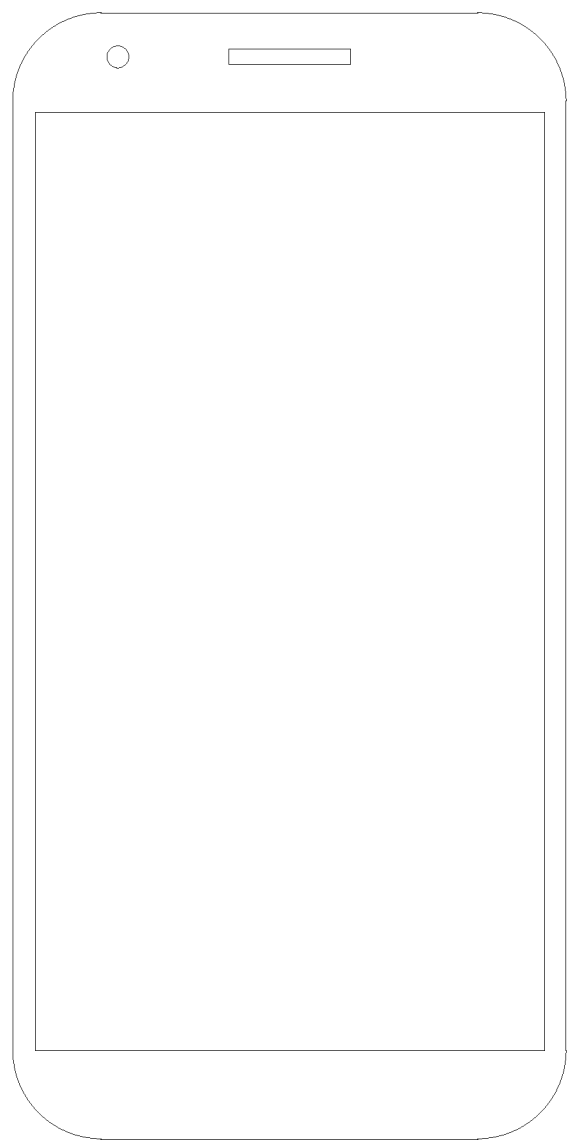
FIG. 11 is a schematic diagram of an OLED display device according to an embodiment of the present disclosure.

Further, an OLED display device is provided according to an embodiment of the present disclosure, which includes the above OLED display panel. The OLED display device may be a cell phone shown in FIG. 11. In other embodiments, the OLED display device may also be a device such as tablet computers, which is not limited in the embodiment.

It should be noted that, the embodiments of the present disclosure are described in a progressive manner and each embodiment places emphasis on the difference from other embodiments. Therefore, one embodiment can refer to other embodiments for the same or similar parts.

According to the description of the disclosed embodiments, the disclosure may be implemented or used by the person skilled in the art. Various modifications made to these embodiments are apparent for persons skilled in the art, and a normal principle defined in the disclosure may be implemented in other embodiments without departing from spirit or scope of the disclosure. Therefore, the disclosure is not limited to the embodiments described in the disclosure but confirms to a widest scope in accordance with principles and novel features disclosed in the disclosure.

The invention claimed is:

1. An organic light emitting diode array substrate, comprising:
    a plurality of data lines and a plurality of scan lines, both the scan lines and the data lines being insulated;
    a plurality of sub-pixels defined by the plurality of data lines and the plurality of scan lines; and
    a resistance-type pressure sensing element, wherein
    each of the plurality of data lines extends in a first direction, and each of the plurality of scan lines extends in a second direction,
    the plurality of sub-pixels comprise a first sub-pixel row, a second sub-pixel row and a third sub-pixel row, the first sub-pixel row, the second-pixel row and the third sub-pixel row being arranged in the first direction in a certain sequence repeatedly, wherein the first sub-pixel row comprises first sub-pixels and second sub-pixels arranged alternately in the second direction, the second sub-pixel row comprises third sub-pixels arranged in the second direction, and the third sub-pixel row comprises fourth sub-pixels and fifth sub-pixels arranged alternately in the second direction, wherein the third sub-pixel is located between the first sub-pixel and the fourth sub-pixel in the first direction, and the third sub-pixel is located between the first sub-pixel and the second sub-pixel in the second direction,
    the resistance-type pressure sensing element comprises a plurality of resistors, each of the plurality of resistors comprising a serpentine wire, the serpentine wire comprising a first sub-wire and a second sub-wire, the second sub-wire being located at one end of the first sub-wire and connected to two adjacent first sub-wires, and
    both the first sub-wire and the second sub-wire are located in non-opening regions of the plurality of sub-pixels, and an extension direction of a projection of the first sub-wire on the array substrate intersects with extension directions of projections of the plurality of data lines and the plurality of scan lines on the array substrate.

2. The organic light emitting diode array substrate according to claim 1, wherein the first sub-pixel, the second sub-pixel, the third sub-pixel, the fourth sub-pixel and the fifth sub-pixel comprise at least a red pixel, a green pixel and a blue pixel.

3. The organic light emitting diode array substrate according to claim 2, wherein the first sub-pixel and the fourth sub-pixel are the red pixels, the second sub-pixel and the fifth sub-pixel are the blue pixels, and the third sub-pixel is the green pixel.

4. The organic light emitting diode array substrate according to claim 2, wherein the first sub-pixel and the fifth sub-pixel are the blue pixels, the second sub-pixel and the fourth sub-pixel are the red pixels, and the third sub-pixel is the green pixel.

5. The organic light emitting diode array substrate according to claim 1, wherein the resistance-type pressure sensing element has an electrical bridge structure formed by a first resistor, a second resistor, a third resistor and a fourth resistor, wherein one end of the first resistor is connected to one end of the second resistor, the other end of the first resistor is connected to one end of the fourth resistor, the other end of the fourth resistor is connected to one end of the third resistor, and the other end of the third resistor is connected to the other end of the second resistor; and both the first sub-wire of the first resistor and the first sub-wire of the third resistor extend in a third direction, and both the first sub-wire of the second resistor and the first sub-wire of the fourth resistor extend in a fourth direction.

6. The organic light emitting diode array substrate according to claim 5, wherein an angle between the third direction and the first direction ranges from 40° to 50°, inclusively.

7. The organic light emitting diode array substrate according to claim 6, wherein an angle between the third direction and the first direction is 45°.

8. The organic light emitting diode array substrate according to claim 7, wherein both the second sub-wire of the first resistor and the second sub-wire of the third resistor extend in the fourth direction, and both the second sub-wire of the second resistor and the second sub-wire of the fourth resistor extend in the third direction.

9. The organic light emitting diode array substrate according to claim 8, wherein the third direction is perpendicular to the fourth direction.

10. The organic light emitting diode array substrate according to claim 9, wherein the first resistor, the second resistor, the third resistor and the fourth resistor have a same structure.

11. The organic light emitting diode array substrate according to claim 10, wherein the first resistor further comprises a third sub-wire, the third sub-wire being connected to adjacent first sub-wires, and at least one sub-pixel being arranged between the third sub-wire and the second sub-wire in the third direction.

12. The organic light emitting diode array substrate according to claim 11, wherein the third sub-wire is arranged in parallel to the second sub-wire.

13. The organic light emitting diode array substrate according to claim 1, wherein one sub-pixel is arranged between two adjacent first sub-wires of each of the plurality of resistors.

14. The organic light emitting diode array substrate according to claim 13, wherein the first sub-wire and the second sub-wire of each of the plurality of resistors have a same width.

15. The organic light emitting diode array substrate according to claim 14, wherein the first sub-wire has a width ranging from 2 μm to 10 μm, inclusively.

16. The organic light emitting diode array substrate according to claim 1, wherein the serpentine wire of the resistance-type pressure sensing element is made of metal.

17. The organic light emitting diode array substrate according to claim 16, further comprising a substrate, wherein the resistance-type pressure sensing element and the plurality of sub-pixels are located on a same side of the substrate, and the resistance-type pressure sensing element is arranged on a surface of a thin film encapsulation layer of the plurality of sub-pixels which is away from the substrate.

18. An organic light emitting diode display panel, comprising the organic light emitting diode array substrate according to claim 1.

19. An organic light emitting diode display device, comprising the organic light emitting diode display panel according to claim 18.

* * * * *